United States Patent [19]

Powers et al.

[11] B 3,995,202

[45] Nov. 30, 1976

[54] CONDITION-INITIATED LOAD CONTROL CIRCUIT

[75] Inventors: John J. Powers, East Weymouth; Joseph R. Thibodeau, Dedham, both of Mass.

[73] Assignee: Sigma Instruments, Inc., Braintree, Mass.

[22] Filed: Nov. 26, 1974

[21] Appl. No.: 527,187

[44] Published under the second Trial Voluntary Protest Program on February 17, 1976 as document No. B 527,187.

[52] U.S. Cl. ............................................. 317/124
[51] Int. Cl.² .......................................... H03H 9/00
[58] Field of Search ........................... 317/124–130; 307/117, 132 EA

[56] References Cited
UNITED STATES PATENTS
2,697,803  12/1954  Eadie, Jr............................. 317/124

*Primary Examiner*—R. N. Envall, Jr.
*Attorney, Agent, or Firm*—Toren, McGeady and Stanger

[57] ABSTRACT

In the device disclosed, a load is energized from energy-carrying lines. A detector responsive to a cyclically recurring physical condition, such as daylight, places a switch either in an operating mode or an idling mode in response to the absence of the condition. A control shifts from an idling mode to an operating mode in response to the detector being in a given one of its modes and shifts back to the idling mode after a given time less than the period of the cyclically recurring physical condition. A circuit responds to the control being shifted to its operating mode in response to the given one of the modes of the detector and responds to the detector simultaneously being in the operating mode so as to connect the lines to the load.

24 Claims, 27 Drawing Figures

CONDITION-INITIATED LOAD CONTROL CIRCUIT

BACKGROUND OF THE INVENTION

This invention relates to circuit controls, and particularly to circuit controllers of the kind which initiate a controlled action in response to a physical condition such as illumination, temperature, humidity, barometric pressure, etc., and the control action is terminated on the basis of time.

A typical application for such a device occurs in regulation of outdoor lighting equipment that is intended to illuminate an area during its normally used evening or nighttime hours. One available type of device is interposed between the current carrying lines and a load. It is composed of a photosensitive element that causes a relay to permit actuation of the lights at sunset in response to the diminishing ambient sunlight. At sunrise the photocell responds to the increasing ambient light and causes the relay to cut off power to the lighting equipment. Such devices are satisfactory but tend to waste substantial amounts of current during the early morning hours when the illuminated area is unused.

Other types of devices for actuating loads in response to physical conditions are illustrated in U.S. Pat. Nos. 3,091,723 and 3,350,581. One of these systems is capable of solving the problem of energy waste by energizing the light only for a predetermined period of time after sunset. However, such a system fails to consider changes in the times of sunrise and sunset throughout the year. If, during the summer, the timing mechanism used is set to turn off the lights 5 hours after a 9 P.M. summer sunset, the same timing mechanism would extinguish the light 5 hours after a 5 P.M. winter sunset, namely at 10 P.M. Such a system is not completely satisfactory if the illuminated facilities are to be used until 2 A.M. On the other hand, accommodating the timing mechanism to a 5 P.M. winter sunset, so that it would extinguish the lights 9 hours later at the desired time of 2 A.M., would result in illumination throughout the night and after sunrise during the summer months.

An object of this invention is to improve condition-initiated load-controlling systems.

Another object of the invention is to alleviate the aforementioned difficulties.

Another object of the invention is to provide means which can be added to existing means for controlling such loads.

SUMMARY OF THE INVENTION

According to a feature of the invention, these objects are attained in whole or in part, by causing a detector to exhibit one mode in response to a cyclical physical condition such as light or darkness, and another mode in response to absence of the condition in response to one mode shifting a circuit controller from one mode to another, and then continuing the controller's second mode for a definite period of time less than the cycle time, during which the load is energized only when both the detector controlled by the change in physical condition and the circuit controller that is energized by the detector are both in the second mode. The load is de-energized by either the detector or the circuit dropping back into the first mode.

According to another feature of the invention, means are provided to sequence the circuit controller so that it normally de-energizes the load.

According to another feature of the invention, these means operate so that if the circuit controller is out of sequence due to a loss of power, the switching action controlled by a reversal of the physical condition de-energizes the load.

According to another feature of the invention, the circuit controller timing is selected to be shorter than the cycling time of the physical condition. Thus the difference in time can determine the rate per physical condition cycle at which the circuit controller resynchronizes itself. Under any set of circumstances the load is not energized for a period of time longer than the operation of the physical condition controlled switching action.

According to another feature of the invention facilities are provided to turn on the light during the early morning hours in the winter months. These facilities turn on the lights at a predetermined number of hours after sunset until sunrise.

These and other features of the invention are pointed out in the claims. Other objects and advantages of the invention will become evident from the following detailed description when read in light of the accompanying drawings.

BRIEF DESCRIPTION OF THE DRAWINGS

FIG. 14 is a circuit diagram of still another system embodying features of the invention;

FIGS. 15 through 20 are graphs illustrating the time relationships of the operations of various components in the system of FIG. 14;

DETAILED DESCRIPTION OF PREFERRED EMBODIMENTS

Figure 1:
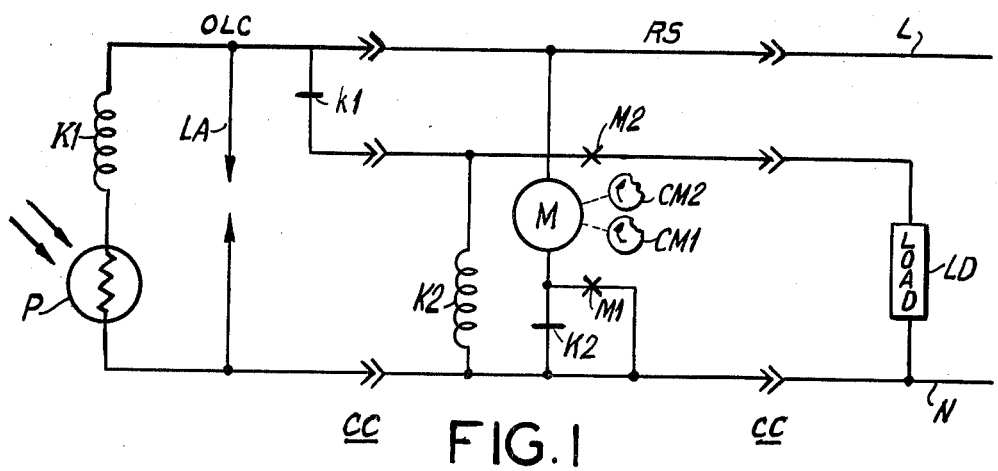
FIG. 1 is a circuit diagram of a system embodying features of the invention.

In FIG. 1, two power lines L and N carrying electrical power, serve to energize a load LD such as a bank of street lights. A conventional optical light control OLC and an intermediate regulating system RS, also energized by the lines L and N through suitable plug or socket connectors CC, intervene between the line L and the load LD to allow the load to be energized only during specified periods after sunset.

This embodiment of the invention particularly concerns energizing street lights in response to changes in illumination. However, it should be recognized that the same kind of system can be used for energizing any type of load in which the control action is initiated in response to any type of physical condition, such as change in illumination, pressure, humidity, temperature, etc. Thus, the load can be in the form of a sprinkler system which responds to changes in humidity detected by a humidity sensitive device in place of the photosensitive device shown in FIG. 1.

Figure 2:
FIGS. 2 through 6 are graphs illustrating the operating conditions, relative to time, of various members utilized in FIG. 1.

In the control OLC, a photosensitive element P exhibits a low resistance in response to the light occurring during daylight hours so that lines L and N pass current through a winding k1 of a relay. The current opens normally closed contacts k1 of the relay as shown in FIG. 2. At the sunset, when daylight hours end, winding K1 is de-energized and contacts k1 close.

Figure 3:
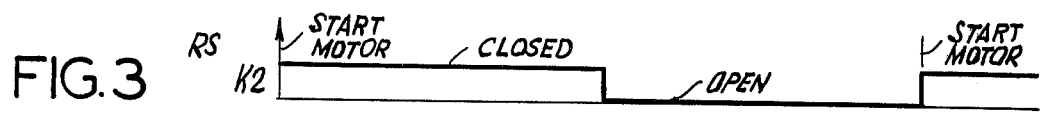

During the daylight hours, with the regulating system RS the lines L and N rotate a motor M through normally closed contacts k2 of a relay having a winding K2. For simplicity the windings K1 and K2 are also referred to as coils K1 and K2 or just relays K1 and K2. The "normally closed" condition refers to the fact that the contacts are closed for passage of current when the relay windings are unenergized. The coil K2 is de-energized during daylight hours as shown in FIG. 3 because during these hours the contacts k1 are open.

Figure 4:
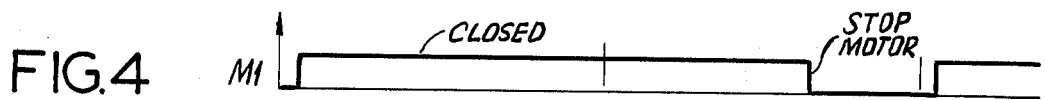

The high portion of a motor latching cam CM1 rotated by the motor M is positioned relative to motor latching contacts M1 to close the contacts M1 shortly after closing of contacts K2 at sunrise has started the motor M as shown in FIG. 4. The contacts M1 keep the motor M running even after contacts k2 open as shown in FIG. 4. The speed of the motor M and the high portion of the latching cam CM1 is selected to keep the motor running for a period of time less than the cycle between sunrise and sunrise.

Figure 5:
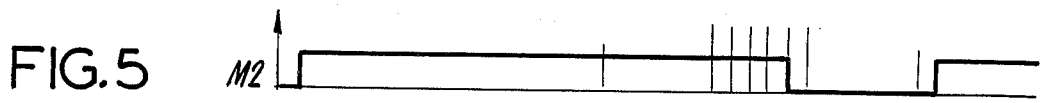
Figure 6:

A timing cam CM2 closes normally open timing contact M2 for a predetermined time period. This time period is selected to start with closing of the contacts M1, namely shortly after sunrise, and to extend to anywhere between 10 p.m. and 2 a.m. as shown in FIG. 5. The lines L and N energize the load LD when both contacts k1 and M2 are closed simultaneously. This occurs from sunset to the end setting from 10 p.m. to 2 a.m. determined by the cam CM2. The cams CM1 and CM2 are fixed relative to one another and driven by the motor M.

The system is initially set to operate so that the cams CM1 and CM2 cause the contacts to be open just before sunrise. The cams CM1 and CM2 are also set to cause the motor to turn on the contacts M1 shortly before the contacts M2 and to cause the contacts M1 to open after the contacts M2.

Thus in operation, sunrise lowers the resistance of the element P enough to energize relay K1, thereby opening contacts k1. This allows relay K2 to permit contacts k2 to close and start the motor M. After a short rotational delay, cam operated contacts M1 and M2 close. Contacts M1 latch the motor and keep it energized even after contacts k2 have opened. Contacts M2 enable the load without energizing it. At sunset the impedance of the element P becomes sufficiently high to de-energize the winding K1 and allow contacts k1 to close. This energizes relay K2 thereby opening contacts k2. The closing of contacts k1 energizes the load LD. Thus, the load which is in the form of a bank of lamps is lit at sunset.

The lamp load LD continues to be lit until the time set for extinction by the cam CM2. At that time, with the rotational delay determined by the speed of the motor and the cam, the contacts M2 open and de-energize the load LD. After some rotational delay, the contacts M1 open, thereby de-energizing the motor. The circuit stays in this quiescent state until start of operation of the next sunrise.

In this manner the lamps forming the load LD are lit from sunset to some specified hour during the night. If the power source supplying the lines L and N is disabled for a period of time, the motor remains in position while the physical conditions produced by sunrise and sunset continue. If power is restored within a time period less than the difference between 24 hours and the total cycle of the regulating system RS, the motor stops before the next sunrise. At the next sunrise the system again starts in synchronism with the sunrise - sunset sequence. Thus, even with normally expectable power failures, the system maintains its normal operating sequence.

In unusual circumstances, the power failure may stop the motor M long enough to keep the contacts M1 and M2 for a period of time beyond the next sunrise. Under these circumstances, the contacts k2 keep energizing the motor M even after the contacts M1 have opened. Because the operating period of the contacts M1 are longer than the period during which the contacts k2 are open, the contacts M1 keep the motor operating even after the contacts k2 open. During this malfunction, the contacts k1 and M2 energize the load throughout the night from sunset to sunrise. This provides a fail-safe system for maintaining lights, although considerable energy may be wasted because of the excessive use.

The continuous operation of the motor by virtue of the overlapping operation of the contacts k2 and M1, periodically opens the contacts M1. Since the total rotating cycle of the motor M1 is less than the 24 hour cycle from sunrise to sunrise, after a few cycles, the open condition of the contacts m1 will coincide with the open condition of the contacts k2. The motor will then not restart until the next sunrise. In this way, the motor resynchronizes itself to the physical condition actuating the system.

Figure 7:
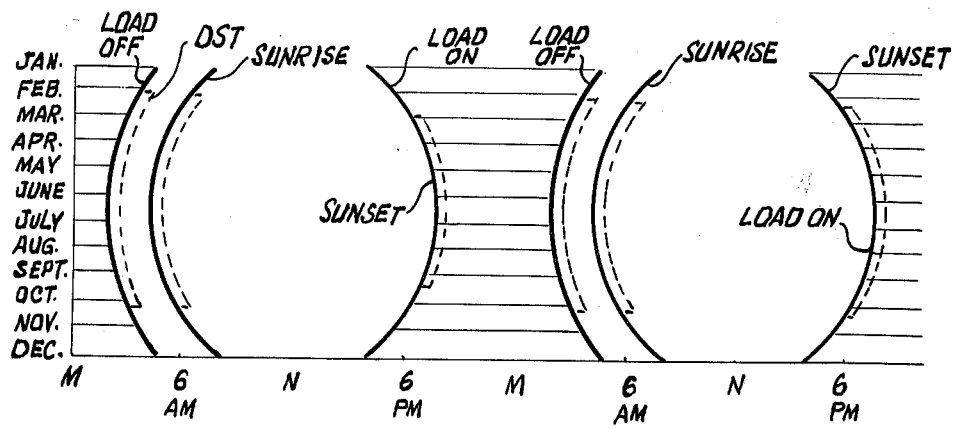
FIG. 7 is a graph illustrating the times of sunrise and sunset, as well as the operating time of a load in FIG. 1 during various months of the year.

FIG. 7 illustrates the time period of sunrise and sunset for the months of the year (shown along the ordinate). The graph also shows the periods during which the load is on during normal operation.

An advantage of the embodiment of the invention shown in FIG. 1, resides in the ability to insert the regulating system RS between a conventional outdoor lighting control OLC and its usual load connection while imparting the operating abilities of the regulating system RS to the overall network.

Figure 8:
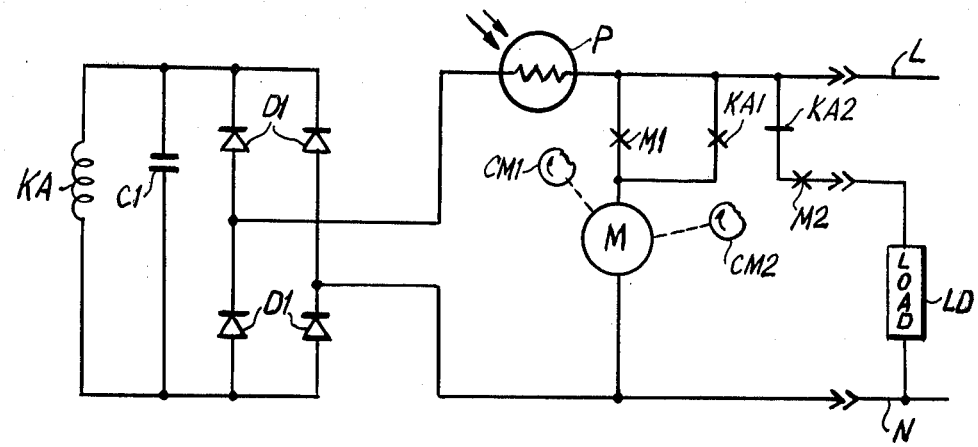
FIG. 8 is a schematic diagram of another system embodying features of the invention.
Figure 9:
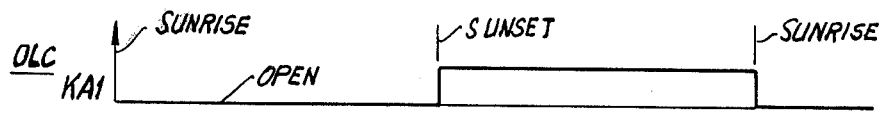
FIGS. 9 through 13 are respective graphs illustrating the operating conditions, relative to time, of various members in the system of FIG. 8.
Figure 10:
Figure 11:
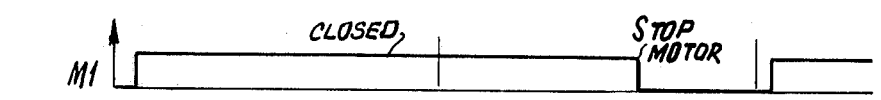

FIG. 8 illustrates another embodiment of the invention. Here the lines L and N energize a direct current relay KA through a rectifier bridge composed of diodes D1. The photoelectric element P again controls energization of the relay KA. In FIG. 8, instead of using two relays, the relay KA simultaneously operates normally open relay contacts K1a and normally closed relay contacts K1b. In normal operation just prior to sunrise, the contacts K1b are closed, the contacts K1a are opened, and the contacts M1 and M2 of the cams CM1 and CM2 driven by the motor M are both open. At sunrise increasing current through the photosensitive element P energizes the relay KA. This opens contacts K1b and closes contacts K1a. The closed contacts K1a allow the lines L and N to energize the motor M. After a short rotational delay the cams CM1 and CM2 close the contacts M1 and M2. The contacts M1 latch the motor M in its energized mode. The contacts M2 enable or set up the lamp load LD. At sunset, the high impedance of the element P de-energizes the relay KA which in turn opens the contacts K1a and closes the contacts K1b. These then energize the load. The aforementioned operations can be seen from FIGS. 9, 10, 11, 12, and 13.

Figure 12:
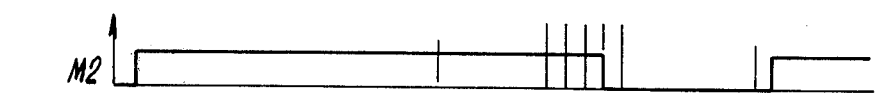
Figure 13:
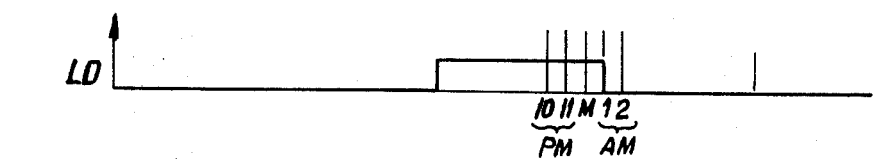

As shown in FIG. 12, after the pre-established rotational delay, the contacts M2 open. This may, for example, occur at 1 A.M. Opening of the contacts M2 de-energizes the load. After a further rotational delay contacts M1 open to stop the motor M. The circuit stays in this quiescent state until the start of operation at the next sunrise.

The circuit of FIG. 8 exhibits the advantages available from the circuit of FIG. 1. However, here, the relay KA may be a simpler direct current relay rather than that conventionally used for outdoor lighting controls. The bridge formed by diodes D1 and filter capacitor, C1, serves to operate the relay KA.

Figures 14, 18, 20:
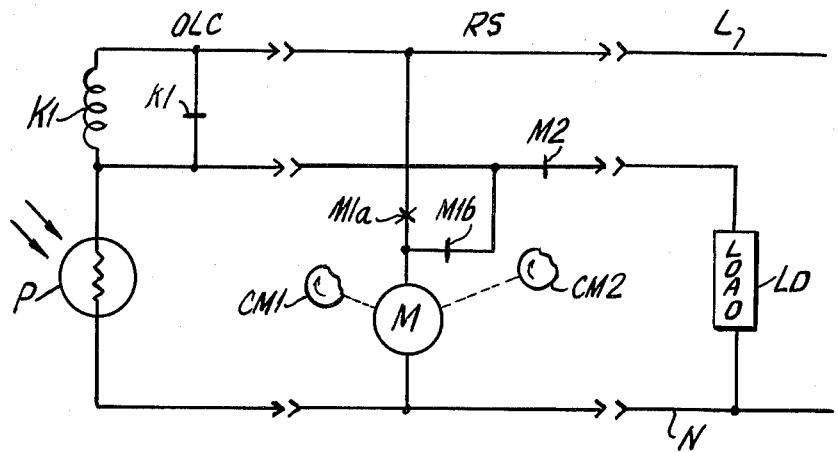

FIG. 14 illustrates another circuit utilizing a conventional outdoor lighting control OLC with a regulating system RS that serves as a timer adapter between the normal load arrangement and the usual control OLC. In FIG. 14 the control action is initiated at sunset. At sunset the high impedance of the photosensitive element P de-energizes the coil K1 thereby closing the contacts K1. This passes current from the line L through the contacts K1 and the contacts M1b through the motor M to start it. The operation of contacts k1, M1b, M1a, and M, are illustrated in FIGS. 15, 16, 17, and 18. As shown in FIGS. 16 and 17, the contacts M1a and M1b are complementary. Thus during rotation the contacts M1a are open when the contacts M1b are closed and vice versa. The cam CM1 closes the contacts M1a to latch the motor M in its operating condition for a period less than the 24 hours, such as a period of 20 hours.

As shown in FIGS. 18, 19 and 20, the timing contacts M2 are operated by the cam CM2 so that the contacts M2 close before the motor stops, such as near noon, and open some time between 9 P.M. and 1 A.M. Since the contacts M2 are closed at sunset, closing of the contacts K1 energizes the load at sunset, opening of the contacts M2 at their predetermined time between 9 P.M. and 1 A.M. de-energizes the load as shown in FIGS. 19 and 20.

Figure 21:
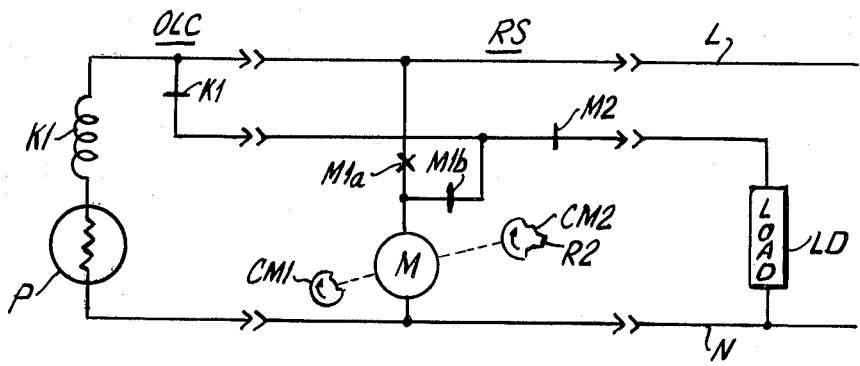
FIG. 21 is a circuit diagram of a variation of the circuit in FIG. 14, also embodying features of the invention.
Figure 22:
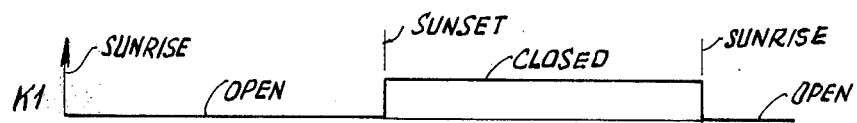
FIGS. 22 through 27 are graphs illustrating the time relationships of the operation of various components of the system in FIG. 21.
Figure 23:
Figure 24:
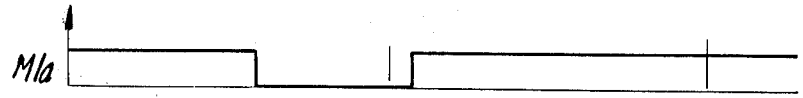
Figure 25:
Figure 26:
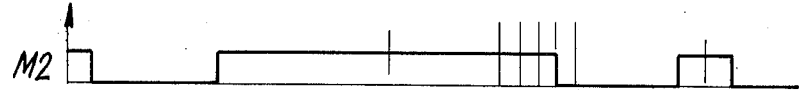
Figure 27:
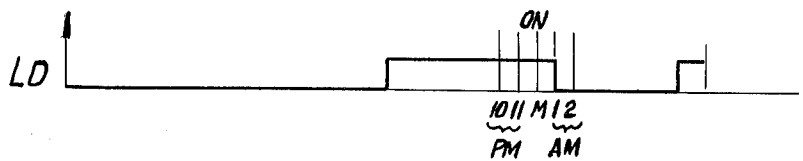

FIG. 21 illustrates a circuit corresponding to that in FIG. 14. The circuit of FIG. 21 differs from that in FIG. 14 in that cam CM2 includes a second rise R2. The latter is positioned relative to the cam CM1 so that the rise R2 closes the contacts M2 a predetermined number of hours, e.g. 12 hours, after the cam CM1 closes the contacts M1a at sunset. It holds the contacts M2 closed for about five hours. Thus with one exception the circuit of FIG. 21 operates the same as that of FIG. 14. FIGS. 22 to 27 illustrate the operation of members K1, M1b, M1a, M, M2, and LD respectively. However, in FIG. 21, as shown in FIGS. 26 and 27, the contacts M2 are closed 12 hours after sunset for a period of about 5 hours.

In operation, during the summer months when the interval between sunset and sunrise is less than 12 hours, the second rise R2 in the cam CM2 and the operation of M2 have substantially no effect upon the load LD. This is so because the contact K1 opens before the contact M2 in series therewith closes. In the winter months, when the sunset to sunrise interval exceeds 12 hours, the cam CM2 closes the contact M2 12 hours after sunset. Since this occurs before sunrise and the contact K1 is closed, the load LD is activated until sunrise when K1 opens.

When the load LD is in the form of street lamps the circuit of FIG. 21 affords all the advantages of that in FIG. 14 with the additional capability of furnishing light in the pre-sunrise hours. This ability is important during yearround daylight savings time. In northern regions of the U.S. daylight does not begin until perhaps 8 or 9 A.M. in mid-winter. Thus the additional light helps early travellers, schoolchildren, and others. This is especially important in the Western part of any time zone.

The invention effectively improves condition initiated load controlling systems. It avoids the waste of energy inherent in failing to extinguish a load operation when its use is no longer needed before a load reversal. For example, it avoids the waste of energy during early morning hours when an illuminated area is not used. It also adjusts itself to changes in the cyclical pattern such as changes in sunrise and sunset throughout the year. Thus in the wintertime the length of the illuminated period is increased, while during the summer the length of the illuminated period is decreased.

The invention permits the system to return to its normal operating sequence even after it has been disabled for a period of time. This is so even in the unusual circumstances where the power failure may extend beyond one or more condition reversals.

While embodiments of the invention have been described in detail, it will be obvious to those skilled in the art that the invention may be otherwise embodied without departing from its spirit and scope.

What is claimed is:

1. An apparatus for energizing a load from energy carrying conductors, comprising detector means responsive to a cyclically recurring physical condition for exhibiting a first mode in response to the physical condition and a second mode in response to the absence of the condition, control means exhibiting a first mode and a second mode and coupled to said detector means for shifting from the first mode to the second mode while the detector means is in the first mode, and for shifting back to the first mode after a given time less than the period of the cyclically recurring physical condition, and circuit means for coupling the detector means and the conductors and the control means and the load in circuit relationship; said circuit means being responsive to said control means being in the second mode, and said detector means simultaneously being in the second mode in response to the absence of the condition, for connecting the lines across the load.

2. An apparatus as in claim 1, wherein said control means shifts from the first to the second mode in response to the detector means entering the first mode.

3. An apparatus as in claim 1, characterized in that said control means includes a motor responsive to the first of said signals, cam means coupled to said motor, contact means responsive to the cam means for latching the motor so it remains energized and second contact means responsive to the cam means for maintaining the control means in its second mode for the given time, said cam means when moved by the motor having a period less than the cyclically recurring physical condition so that the motor is latched for a period of time less than the cyclically recurring physical condition.

4. An apparatus as in claim 2, characterized in that said control means includes a motor responsive to the first of said signals, cam means coupled to said motor, contact means responsive to the cam means for latching the motor so it remains energized and second contact means responsive to the cam means for maintaining the control means in its second mode for the given time, said cam means when moved by the motor having a period less than the cyclically recurring physical condition so that the motor is latched for a period of time less than the cyclically recurring physical condition.

5. An apparatus as in claim 1, wherein said detector means includes a photosensitive element and the physical condition to which said detector means exhibits its first mode is darkness.

6. An apparatus as in claim 1, wherein said detector means includes a photosensitive element and the physical condition to which said detector means exhibits its first mode is light.

7. An apparatus as in claim 1, wherein said detector means includes an alternating current actuable relay having contacts.

8. An apparatus as in claim 1, wherein said detector means includes a direct current relay and a rectifying circuit for energizing the relay.

9. An apparatus as in claim 1, characterized in that said detector means includes a detector and a relay responsive to said detector, said relay having contacts, said control means including a motor responsive to the first of said signals, cam means coupled to said motor contact means responsive to the cam means for latching the motor so it remains energized for a given period, and second contact means responsive to the cam means for maintaining the control means in its second mode for a given time.

10. An apparatus as in claim 7, characterized in that the contacts of the relay of said detector means are connected in series with the second contact means of said control means.

11. An apparatus as in claim 1, wherein the control means includes means for again shifting to the second mode after the shift back to the first mode and a predetermined period after the detector means shifts to the second mode.

12. An apparatus for regulating the current flow to a load from a power line through a detector switch which assumes alternate switching modes in response to a cyclically recurring physical condition, comprising a control switch, circuit means for connecting the control switch to the load and to the detector switch, an actuable clocking device, a first timing switch connected to the clocking device, a second timing switch connected to the clocking device, and coupling means coupling said first timing switch to said circuit means and said control switch to said clocking device, said coupling means causing said first timing switch to actuate said clocking device in response to one of two current flow statuses in said circuit means and causing the second timing switch to latch the clocking device in the actuated condition for a predetermined period extending into the second of the two current flow statuses of said circuit means and closing the control switch in response to operation of the clocking device for a second predetermined period during actuation of the clocking device.

13. An apparatus as in claim 12, wherein the first of the two statuses of current flow in said circuit means is a flow of current and the second status is the absence of current.

14. An apparatus as in claim 12, wherein the first of the two statuses of current flow in said circuit means is the absence of current and the second of the two statuses is the presence of current.

15. An apparatus as in claim 12, wherein two conductors are adapted to be connected to power lines and said first timing switch and said second timing switch when respectively closed connect said clocking device between said conductors.

16. An apparatus as in claim 15, wherein the first current status of said circuit means is the absence of current and said coupling means includes a relay coil which when unactuated closes the first timing switch, said coupling means including a time actuated switch closer responsive to said clocking means for closing said second timing switch while said first timing switch actuates said clocking mechanism and for retaining the second timing switch closed for a predetermined period from the actuation of said clocking device, said coupling means including a second time actuated switch closer responsive to said clocking device for closing the control switch for the second predetermined time during closure of the control switch.

17. An apparatus as in claim 16, wherein said clocking device is a motor and said switch closers are cams coupled to the motor.

18. An apparatus as in claim 12, wherein said first current status is the absence of current and wherein said first timing switch connects said clocking mechanism to said circuit means, further comprising a conductor adapted to be connected to the line, said second timing switch when closed connecting said clocking mechanism to the conductor, said coupling means including a first time controlled switch closer for alternately closing said first and second timing switches so that said first timing switch is closed during the first status and remains closed through a portion of the second status and said second timing switch is closed during other times, said coupling means setting said closers so that said clocking mechanism starts during the second current status and ends partially through the first current status, said coupling means including a third switch closer closing said control switch during the time that said second timing switch is closed and during the first status, said third closer closing said coupling means for the second predetermined time.

19. An apparatus as in claim 18, wherein said third closer closes said control switch a third given period after actuation of said clocking device for a supplemental given time period in addition to the second predetermined period.

20. An apparatus as in claim 19, wherein said clocking device is a motor and said coupling means include cams.

21. An apparatus as in claim 12, wherein the coupling means is adapted to close the second timing switch for a time less than a cycle of the cyclically recurring physical condition.

22. An apparatus for energizing light from energy carrying conductors, comprising light detector means responsive to cyclically recurring daylight for switching into a nonconductive open mode in response to daylight and a conductive closed mode in response to the absence of daylight, a control switching arrangement exhibiting a nonconductive open mode and a conductive closed mode and coupled to said detector means for shifting from the open mode to the closed mode while the detector means is in the open mode and for shifting back to the open mode after a given time less than the period of the cyclically recurring daylight, and a circuit coupling the detector means and the conductors and the control switch and the load in circuit relationship; said circuit arrangement being responsive to said control switch being in the closed mode, and said detector means simultaneously being in the closed mode in response to absence of daylight for connecting the lines to the load.

23. An apparatus for regulating the current flow to a load from a power line through a detector switch which assumes alternate switching modes in response to a cyclically recurring physical condition, comprising a control switch connectable between the detector switch and the load and assuming alternate switching modes, an actuable clocking device, first switching means responsive to one of the switching modes of the detector switch and coupled to the clocking device for actuating the clocking device, second switching means coupled to the clocking device and responsive to operation of the clocking device for latching the clocking device in its operable position for a predetermined time, said clocking device being coupled to said control switch for causing said control switch to assume a predetermined switching mode for a predetermined time less than the period of the cyclically recurring condition, said control switch and the detector switch together connecting the line to the load in response to simultaneous occurrence of a predetermined one of the switching modes.

24. An apparatus for regulating the current flow to a load from a power line through a detector switch responsive to a cyclically recurring physical condition and exhibiting a first mode in response to the physical condition and a second mode in response to the absence of the condition, comprising control means exhibiting a first mode and a second mode and coupleable to the detector switch for switching from the first mode to the second mode while the detector switch is in the first mode and for shifting back to the first mode after a given time less than the period of the cyclically recurring physical condition, and circuit means for coupling the control means to the load and the detector switch so that the lines are connected across the load when the control means and the detector switch simultaneously assume the second mode in response to the absence of the physical condition.

* * * * *